United States Patent
Kim et al.

(10) Patent No.: US 9,595,684 B2
(45) Date of Patent: *Mar. 14, 2017

(54) SUBSTRATE FOR ORGANIC ELECTRONIC DEVICE HAVING HIGH REFRACTIVE LAYER ON LIGHT SCATTERING, OPTICAL FUNCTIONAL LAYER

(71) Applicant: LG CHEM. LTD., Seoul (KR)

(72) Inventors: Ji Hee Kim, Daejeon (KR); Jung Hyoung Lee, Daejeon (KR); Jun Rye Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/437,428

(22) PCT Filed: Dec. 2, 2013

(86) PCT No.: PCT/KR2013/011098
§ 371 (c)(1),
(2) Date: Apr. 21, 2015

(87) PCT Pub. No.: WO2014/084699
PCT Pub. Date: Jun. 5, 2014

(65) Prior Publication Data
US 2015/0287941 A1    Oct. 8, 2015

(30) Foreign Application Priority Data

Nov. 30, 2012  (KR) .......... 10-2012-0138343
Dec. 2, 2013   (KR) .......... 10-2013-0148768

(51) Int. Cl.
*H01L 51/00*    (2006.01)
*H01L 51/52*    (2006.01)
*H01L 51/56*    (2006.01)

(52) U.S. Cl.
CPC ...... *H01L 51/0097* (2013.01); *H01L 51/0001* (2013.01); *H01L 51/5268* (2013.01);
(Continued)

(58) Field of Classification Search
CPC . H01L 51/0097; H01L 51/0001; H01L 51/56; H01L 51/5268
See application file for complete search history.

(56) References Cited

U.S. PATENT DOCUMENTS

2008/0137206 A1* 6/2008 Nakamura .............. G02B 1/111
                                                 359/601
2011/0024779 A1* 2/2011 Nakamura .............. B82Y 20/00
                                                 257/98
(Continued)

FOREIGN PATENT DOCUMENTS

JP      08176293 A      9/1996
JP      2006-100042     4/2006
(Continued)

OTHER PUBLICATIONS

Yu, H. L, et al. In "New apparatus for haze measurement for transparent media," (2006), Institute of Physics Publishing, Measurement Science and Technology, vol. 17, N29-N36.*

*Primary Examiner* — Michael Jung
(74) *Attorney, Agent, or Firm* — Dentons US LLP

(57) ABSTRACT

Provided are a substrate for an organic electronic device (OED), an organic electronic system, a method of manufacturing the substrate or the system, a light source for a display, and a lighting device. The substrate for an OED may form an organic electronic system having excellent performances including light extraction efficiency.

12 Claims, 2 Drawing Sheets

(52) U.S. Cl.
CPC ...... *H01L 51/56* (2013.01); *H01L 2251/5338* (2013.01); *Y02E 10/549* (2013.01); *Y10T 156/10* (2015.01); *Y10T 428/24355* (2015.01); *Y10T 428/24942* (2015.01); *Y10T 428/31623* (2015.04); *Y10T 428/31663* (2015.04)

(56) References Cited

U.S. PATENT DOCUMENTS

| | | | | |
|---|---|---|---|---|
| 2012/0098421 | A1* | 4/2012 | Thompson | B32B 27/08 313/512 |
| 2012/0295372 | A1 | 11/2012 | Schwab | |
| 2014/0021492 | A1* | 1/2014 | Wolk | H01L 51/5275 257/88 |
| 2014/0264317 | A1* | 9/2014 | Uezawa | G02B 5/021 257/40 |
| 2015/0260882 | A1* | 9/2015 | Furui | G06F 3/0412 345/173 |
| 2015/0299449 | A1* | 10/2015 | Ozawa | C08L 33/12 362/611 |
| 2015/0303389 | A1* | 10/2015 | Kim | H01L 51/0097 257/40 |
| 2015/0337075 | A1* | 11/2015 | Oshima | C08J 5/24 523/466 |

FOREIGN PATENT DOCUMENTS

| | | |
|---|---|---|
| JP | 2007-290916 | 11/2007 |
| JP | 2007335253 A | 12/2007 |
| JP | 2009-076452 | 4/2009 |
| JP | 2012-089313 A | 5/2012 |
| KR | 1020050077859 A | 8/2005 |
| KR | 1020100063729 A | 6/2010 |
| KR | 1020120007472 A | 1/2012 |
| KR | 10-1114352 B1 | 2/2012 |
| KR | 1020120024510 A | 3/2012 |
| KR | 10-2012-0101307 A | 9/2012 |
| KR | 10-2012-0125280 A | 11/2012 |
| TW | 201242415 A1 | 10/2012 |
| WO | 2011033751 A1 | 3/2011 |

\* cited by examiner

SUBSTRATE FOR ORGANIC ELECTRONIC DEVICE HAVING HIGH REFRACTIVE LAYER ON LIGHT SCATTERING, OPTICAL FUNCTIONAL LAYER

This application is a National Stage Entry of International Application No. PCT/KR2013/011098, filed Dec. 2, 2013, and claims the priority to and benefit of Korean Application Nos. 10-2012-0138343 filed on Nov. 30, 2012 and 10-2013-0148768 filed on Dec. 2, 2013, all of which are hereby incorporated by reference in their entirety for all purposes as if fully set forth herein.

TECHNICAL FIELD

The present application relates to a substrate for an organic electronic device (OED), an organic electronic system, a method of manufacturing the substrate or the system, a light source, and a lighting device.

BACKGROUND ART

An OED is a device including at least one layer of an organic material capable of conducting a current as disclosed in Japanese Laid-Open Patent Application No. 1996-176293 (Reference 1). Such OEDs include an organic light emitting device (OLED), an organic solar cell, an organic photo conductor (OPC), and an organic transistor.

Conventionally, an OLED, which is a representative OED, sequentially includes a substrate, a first electrode layer, an organic layer, and a second electrode layer. In a structure known as a bottom emitting device, the first electrode layer may be a transparent electrode layer, and the second electrode layer may be a reflective electrode layer. In addition, in a structure known as a top emitting device, the first electrode layer may be formed as a reflective electrode layer, and the second electrode layer may be formed as a transparent electrode layer. Electrons and holes injected by the electrode layers are recombined in the emitting layer located in the organic layer, resulting in generation of light. The light may be emitted to the substrate in the bottom emitting device, or to the second electrode layer in the top emitting device.

In the structure of the OLED, indium tin oxide (ITO) generally used as the transparent electrode layer, the organic layer, and the substrate, which is conventionally formed of glass, have refractive indexes of approximately 2.0, 1.8, and 1.5, respectively. In such a relationship of the refractive indexes, for example, the light generated in the emitting layer in the bottom emitting device is trapped at an interface between the organic layer and the first electrode layer or in the substrate due to a total internal reflection phenomenon, and only a very small amount of light is emitted.

In addition, recently, as interest in flexible OEDs has increased, a demand for technology for replacing a glass-based substrate with a polymer-based substrate in a structure of the OLED has been increasing.

DOCUMENT OF PRIOR ART

Patent Document 1: Japanese Patent Publication No. 1996-176293

DISCLOSURE

Technical Problem

The present application is directed to providing a substrate for an organic electronic device (OED), an organic electronic system, a method of manufacturing the substrate or the system, a light source, and a lighting device.

Technical Solution

One aspect of the present application provides a substrate for an OED, which includes an organic electronic system, a method of manufacturing the substrate or the system, a light source, and a lighting device.

One embodiment of substrate for an OED includes a first polymer base layer, an optical functional layer, and a high refractive layer. Here, the optical functional layer and the high refractive layer may be sequentially stacked on the first polymer base layer, and thus the optical functional layer may be present between the first polymer base layer and the high refractive layer. FIG. 1 shows an exemplary substrate for an OED 1 including a structure in which an optical functional layer 102 and a high refractive layer 103 are sequentially formed on a first polymer base layer 101. In another embodiment, the substrate for an OED may have a structure in which the above-described structure is repeated, and for example, a structure in which a first polymer base layer, an optical functional layer, a high refractive layer, a first polymer base layer, an optical functional layer, and a high refractive layer are sequentially stacked.

In the substrate, as the first polymer base layer, without particular limitation, a suitable polymer base layer may be used. For example, when a substrate is applied to a bottom emitting device, a transparent polymer base layer, for example, a polymer base layer having a transmittance with respect to light in a visible region of 50% or more may be used. When needed, the polymer base layer may be a TFT substrate having a driving TFT. When the substrate is applied to a top emitting device, the polymer base layer may not necessarily be a transparent base layer. When needed, a reflective layer using aluminum may be formed on a surface of the polymer base layer.

As the first polymer base layer, for example, a polymer base layer having a refractive index with respect to light with a wavelength of 633 nm of approximately 1.5 or more, 1.6 or more, 1.65 or more, or 1.7 or more may be used. In one embodiment, a thickness of the first polymer layer is not particularly limited, and for example, a polymer base layer having a thickness of 10 to 100 μm may be used. In one embodiment, as the first polymer base layer, a polymer base layer satisfying Equation 1 may be used.

$$15\ \mu m \le n \times d \le 200\ \mu m \qquad \text{[Equation 1]}$$

In Equation 1, n is a refractive index of the first polymer base layer with respect to light with a wavelength of 633 nm, and d is a thickness of the first polymer base layer. For the polymer base layer satisfying Equation 1, a product of the refractive index with respect to light with a wavelength of 633 nm and a thickness of the polymer base layer may be 15 μm to 200 μm, 30 μm to 100 μm, or 45 μm to 60 μm. When the first polymer base layer satisfies the above range, cracking of the following first electrode layer, for example, an ITO electrode layer caused by stress when the polymer base layer is applied to an OED as a substrate may be mitigated, and thus an OED having more excellent durability and light extraction performance may be implemented.

As the first polymer base layer, for example, a base layer including a poly(amic acid), polyimide, polyethylene naphthalate, polyether ether ketone, polycarbonate, polyethylene terephthalate, polyether sulfide, polysulfone or acryl resin may be used, but the present invention is not limited thereto. In one suitable embodiment, in terms of a process temperature or a light extraction performance, as the first polymer base layer, a base layer including a polyimide may be used.

In one embodiment, the base layer including a polyimide may include, for example, a polyimide having a refractive index with respect to light with a wavelength of 633 nm of approximately 1.5 or more, 1.6 or more, 1.65 or more, or 1.7 or more. Such a high refractive polyimide may be prepared using, for example, a monomer in which a halogen atom other than fluorine, a sulfur atom, or a phosphorus atom is introduced.

In one embodiment, as the polyimide included in the base layer, one prepared by iminizing a poly(amic acid) having a refractive index with respect to light with a wavelength of 633 nm of approximately 1.5 or more, 1.6 or more, 1.65 or more, or 1.7 or more may be used. In one embodiment, as the poly(amic acid), a poly(amic acid) having a part binding to a particle such as a carboxyl group to enhance dispersion stability of the particle may be used. As the poly(amic acid), for example, a compound including a repeating unit of Formula 1 may be used.

approximately 10,000 to 100,0000 or 10,000 to 50,000. In addition, the poly(amic acid) having the repeating unit of Formula 1 has a light transmittance in the visible region of 80, 85, or 90% or more, and excellent thermal resistance.

In the substrate, the optical functional layer may be located on the first polymer base layer. As the optical functional layer, an optical functional layer having a haze of 10% to 50%, 20% to 40%, or 25% to 35% may be used. A method of measuring the haze is not particularly limited, and the haze may be measured using a general hazemeter, for example, HM-150 according to the specification of JIS K7105. When the haze of the optical functional layer is in the above range, light transmitted from an organic layer may be suitably scattered, refracted or diffracted, and thus total reflection at an interface between two layers among an organic layer, an optical functional layer and a base layer may be overcome or mitigated.

The optical functional layer may be, for example, a light scattering layer. The term "light scattering layer" may refer to, for example, any kind of layer formed to scatter, refract

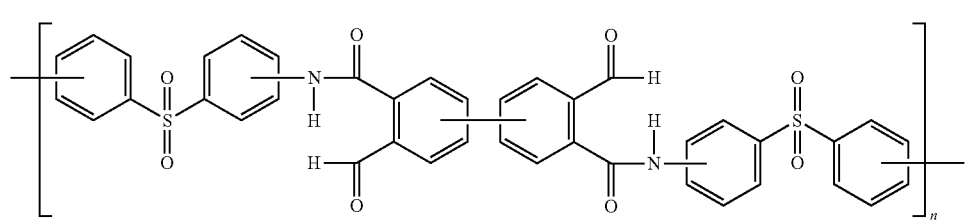

[Formula 1]

In Formula 1, n may be a positive number, for example, a positive number of 1 or more.

The repeating unit may be optionally substituted with at least one substituent. As the substituent, a functional group including a halogen atom other than fluorine, a halogen atom such as a phenyl group, a benzyl group, a naphthyl group, or a thiophenyl group, a sulfur atom, or a phosphorus atom may be used.

The poly(amic acid) may be a homo polymer formed only with the repeating unit of Formula 1, or a block or random copolymer including another unit in addition to the repeating unit of Formula 1. In case of the copolymer, the kind or ratio of the additional repeating unit may be suitably selected within a range that does not inhibit a desired refractive index, thermal resistance, or light transmittance.

As a specific example of the repeating unit of Formula 1, a repeating unit of Formula 2 may be used.

or diffract light incident on the layer. An implemented type of the light scattering layer is not particularly limited as long as it is implemented to have the above-described function.

The light scattering layer may be, for example, a layer including a matrix material and a scattering region. FIG. 2 shows a type in which an exemplary light scattering layer including a scattering region 1022 formed of scattering particles and a matrix material 1021 is formed on the first polymer base layer 101. The term "scattering region" used herein may refer to, for example, a region which can have a different refractive index from a matrix material or a surrounding material such as a high refractive layer to be described later, and a suitable size, thereby scattering, refracting or diffracting incident light. The scattering region may be, for example, formed of particles having a refractive index and a size as will be described later, or may be an empty space. For example, a scattering region may be

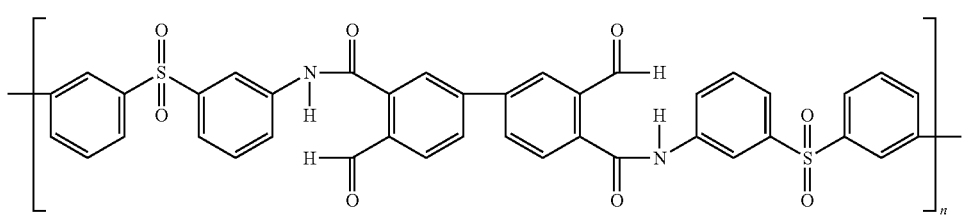

[Formula 2]

In Formula 2, n is a positive number, for example, a positive number of 1 or more.

The poly(amic acid) may have, for example, a weight average molecular weight converted with standard polystyrene measured by a gel permeation chromatograph (GPC) of formed using particles having a refractive index which is different from and higher or lower than that of the surrounding material. The refractive index of the scattering particles may have a difference with that of the surrounding material, for example, the matrix material and/or a high refractive layer of more than 0.3 or 0.3 or more. For example, the scattering particles may have a refractive index of approximately 1.0 to 3.5, or 1.0 to 3.0. The refractive index of the scattering particles is a refractive index measured with respect to light with a wavelength of approximately 550 nm. The refractive index of the scattering particles may be, for example, 1.0 to 1.6, or 1.0 to 1.3. In another embodiment, a refractive index of the scattering particles may be approximately 2.0 to 3.5 or 2.2 to 3.0. As the scattering particles, for example, particles having an average particle size of 50 nm or more, 100 nm or more, 500 nm or more, or 1,000 nm or more. The average particle size of the scattering particles may be, for example, 10,000 nm or less. The scattering region is an empty space having the above-described size, and may be formed by a space filled with air.

The scattering particles or region may have a circular, oval, polygonal or amorphous shape, but the shape is not particularly limited thereto. As the scattering particles, for example, particles including an organic material such as a polystyrene or a derivative thereof, an acrylic resin or a derivative thereof, a silicon resin or a derivative thereof, or a novolac resin or a derivative thereof, or an inorganic material such as silica, alumina, titanium oxide, or zirconium oxide. The scattering particles may include any one of the above-described materials or at least two thereof. For example, as the scattering particles, particles formed in hollow particles such as hollow silica or core/shell-type particles may be formed.

The light scattering layer may further include a matrix material maintaining a scattering region such as scattering particles. The matrix material may be formed using, for example, a material having a refractive index similar to that of another adjacent material such as the base layer or a material having a higher refractive index than the adjacent material. The matrix material may be, for example, a heat or photo curable monomeric, oligomeric, or polymeric organic material including a polyimide, a caldo resin having a fluorene ring, urethane, an epoxide, a polyester, or an acrylate, an inorganic material such as silicon oxide, silicon nitride, silicon oxynitride, or polysiloxane, or an organic/inorganic combination material.

The matrix material may include a polysiloxane, poly (amic acid) or polyimide. Here, the polysiloxane may be formed by polycondensating, for example, a condensable silane compound or a siloxane oligomer, thereby forming a matrix material based on a bond (Si—O) between silicon and oxygen. During the formation of the matrix material, a polysiloxane is prepared only based on a siloxane bond (Si—O) by controlling a condensation condition, or some organic groups such as an alkyl group or a condensable functional group such as an alkoxy group can remain. In addition, as the matrix material, a poly(amic acid) or polyimide may be used, and with respect to the poly(amic acid) or polyimide, the above descriptions on the first polymer base layer may apply.

The light scattering layer may be, for example, a layer having an uneven structure. FIG. 3 is a diagram showing a light scattering layer 1023 having an uneven structure formed on a base layer 101. When the uneven structure of the light scattering layer is suitably controlled, incident light may be scattered. The light scattering layer having an uneven structure may be manufactured by, for example, curing a heat or photocurable material in contact with a mold capable of transferring a desired shape of an uneven structure in a process of curing a heat or photocurable material, or forming an uneven structure through an etching process after forming a layer formed of a material for forming a light scattering layer. Alternatively, the light scattering layer may be formed by blending particles having a suitable size and shape in a binder for forming the light scattering layer. In this case, the particles need not be particles having a scattering function, but particles having a scattering function may also be used.

For example, the light scattering layer may be formed by coating a material by wet coating, and performing application of heat or irradiation of light, curing of the material by a sol-gel method, deposition such as chemical vapor deposition (CVD) or physical vapor deposition (PVD), nanoimprinting or microembossing, but the present invention is not limited thereto.

When needed, the light scattering layer may further include high refractive particles. The term "high refractive particles" may refer to particles having a refractive index of, for example, 1.5, 2.0, 2.5, 2.6 or 2.7 or more. The upper limit of the refractive index of the high refractive particles may be selected in the range capable of satisfying a desired refractive index of the light scattering layer. The high refractive particles may have, for example, an average particle size smaller than that of the scattering particles. The high refractive particles may have an average particle size of, for example, approximately 1 nm to 100 nm, 10 nm to 90 nm, 10 nm to 80 nm, 10 nm to 70 nm, 10 nm to 60 nm, 10 nm to 50 nm, or 10 nm to 45 nm. As the high refractive particles, alumina, alumino silicate, a titanium oxide, or a zirconium oxide may be used. As the high refractive particles, for example, as particles having a refractive index of 2.5 or more, rutile-type titanium oxide may be used. The rutile-type titanium oxide has a higher refractive index than other particles, and thus can be controlled to have a desired refractive index at a relatively small amount. The refractive index of the high refractive particles may be measured with respect to light with a wavelength of 550 nm.

A thickness of the optical functional layer is not particularly limited, but may be, for example, approximately 500 nm to 1,000 nm, 500 nm to 900 nm, or 500 nm to 800 nm.

In the substrate, a high refractive layer may be located on the optical functional layer. The high refractive layer may be, for example, a layer having a refractive index with respect to light with a wavelength of 633 nm of 1.6 to 2.0, 2.0 to 1.8, or 1.85 to 1.90. The high refractive layer may provide a surface capable of forming an electrode on the optical functional layer, and may implement better light extraction efficiency through interaction with the optical functional layer within the above range of the refractive index.

The high refractive layer may be, for example, a planarization layer.

The planarization layer may include, for example, high refractive particles along with a binder. For example, the planarization layer may be formed using a composition prepared by mixing high refractive particles with the binder. The planarization layer may provide a surface capable of forming an OED including an electrode layer, and have a light scattering ability, thereby improving light extraction efficiency of the device. The planarization layer may have a refractive index equal to or higher than that of an adjacent electrode layer, and may be, for example, 1.7 or more, 1.8 to 3.5, or 2.2 to 3.0. When the planarization layer is formed on the light scattering layer formed in the above-described uneven structure, the planarization layer may be formed to have a different refractive index from the light scattering layer.

As a binder, a known material may be used without particular limitation. As the binder, for example, various organic binders, inorganic binders, or organic/inorganic binders known in the art may be used. In consideration of a life span or excellent resistance to a high temperature process, a photolithography process, or an etching process performed in manufacture of the device, an organic binder, an inorganic binder, or an organic/inorganic binder having excellent chemical resistance may be selected and used. The binder may have, for example, a refractive index of approximately 1.4, 1.45, 1.5, 1.6, 1.65, or 1.7 or more. The upper limit of the refractive index of the binder may be selected within a range that can satisfy the refractive index of the planarization layer in consideration of a refractive index of the particles blended together. As the binder, for example, the matrix material, an epoxy resin, polysiloxane or polyimide described in the category of the light scattering layer may be used.

As the binder, for example, a high refractive binder or a low refractive binder may be used. The term "high refractive binder" used herein may refer to a binder having a refractive index of approximately 1.7 to 2.5, or 1.7 to 2.0, and the term "low refractive binder" used herein may refer to a binder having a refractive index of approximately 1.4 or more and approximately less than 1.7. Various kinds of such binders are known in the art, or a suitable one of such known binders other than these may be selected and used.

The planarization layer may further include high refractive particles. In the planarization layer, the term "high refractive particles" may refer to, for example, particles having a refractive index of 1.8, 2.0, 2.2, 2.5, 2.6, or 2.7 or more. The upper limit of the refractive index of the high refractive particles may be selected within a range that can satisfy the refractive index of the planarization layer, for example, in consideration of a refractive index of a binder blended together. The high refractive particles may have, for example, an average particle size of approximately 1 nm to 100 nm, 10 nm to 90 nm, 10 nm to 80 nm, 10 nm to 70 nm, 10 nm to 60 nm, 10 nm to 50 nm, or 10 nm to 45 nm. As the high refractive particles, for example, alumina, alumino silicate, titanium oxide, or zirconium oxide may be used. As the high refractive particles, for example, rutile-type titanium oxide particles, which have a refractive index of 2.5 or more, may be used. The rutile-type titanium oxide may have a higher refractive index than other particles, and thus may be controlled to a desired refractive index at a relatively small amount. The refractive index of the high refractive particles may be measured with respect to light with a wavelength of 550 or 633 nm. In one embodiment, the planarization layer may include high refractive particles having a refractive index with respect to light with a wavelength of 633 nm of 1.8 or more, and an average particle size of 50 nm or less.

A ratio of the high refractive particles in the planarization layer is not particularly limited, and may be controlled within a range that can ensure the above-described refractive index of the planarization layer. In consideration of physical properties of the planarization layer, for example, moisture or vapor transmitting properties, or outgassing of the planarization layer, the high refractive particles may be included in the planarization layer in an amount of 300, 250, 200, 150, or 120 parts by weight or less with respect to 100 parts by weight of the binder. In addition, the high refractive particles may be included in an amount of, for example, 40, 60, 80, or 100 parts by weight or less. Unless particularly defined otherwise, the unit "parts by weight" used herein refers to a weight ratio between components. As the ratios between the binder and high refractive particles are maintained as described above, for example, when an OED is formed, external quantum efficiency may be increased, penetration of gas or moisture from an external environment may be prevented, and outgassing may be reduced, thereby providing a device having excellent performance and reliability.

The planarization layer may be formed by, for example, coating a material by wet coating, and performing application of heat or irradiation of light, curing of the material by a sol-gel method, deposition such as chemical vapor deposition (CVD) or physical vapor deposition (PVD), or microembossing, but the present invention is not limited thereto.

In another embodiment, the planarization layer may be formed of a material prepared by blending a compound such as an alkoxide or acylate of a metal such as zirconium, titanium or cerium with a binder having a polar group such as a carboxyl group or a hydroxyl group. The compound such as an alkoxide or acylate may be condensed with a polar group in the binder to include the metal in a backbone of the binder, thereby implementing a high refractive index. Examples of the alkoxide or acylate compound may include a titanium alkoxide such as tetra-n-butoxy titanium, tetraisopropoxy titanium, tetra-n-propoxy titanium, or tetraethoxy titanium, a titanium acylate such as titanium stearate, a titanium chelate, a zirconium alkoxide such as tetra-n-butoxy zirconium, tetra-n-propoxy zirconium, tetraisopropoxy zirconium, or tetraethoxy zirconium, a zirconium acylate such as zirconium tributoxystearate, or a zirconium chelate. The planarization layer may also be formed by a sol-gel coating method including preparing a coating solution by blending a metal alkoxide such as a titanium alkoxide or zirconium alkoxide with a solvent such as an alcohol or water, coating the solution, and plasticizing the coated solution at a suitable temperature.

As the high refractive layer, for example, a second polymer base layer may be used. As the second polymer base layer, for example, a polymer base layer having a refractive index of approximately 1.5, 1.6, 1.65, or 1.7 or more may be used. In the second polymer base layer, the term "refractive index" may refer to, unless particularly defined otherwise, a refractive index with respect to light with a wavelength of 633 nm. The second polymer base layer may be, for example, a base layer including a poly(amic acid), polyimide, polyethylene naphthalate, polyether ether ketone, polycarbonate, polyethylene terephthalate, polyether sulfide, polysulfone or an acryl resin, but the present invention is not limited thereto. In a suitable example, as the second polymer base layer, a layer including a polyimide may be used, and the above descriptions of the first polymer base layer may apply thereto. A thickness of the second polymer base layer is not particularly limited, and may be smaller than that of the first polymer base layer, which may be, for example, 10 μm or less.

In one embodiment, the high refractive layer, as described above, may have a structure in which any of a planarization layer or the second polymer base layer is formed, or a structure in which a planarization layer and the second polymer base layer are stacked.

In one embodiment, the substrate for an OED may further include a carrier substrate. In the substrate for an OED, for example, the carrier substrate may be in contact with a side of the first polymer base layer opposite to the optical functional layer. That is, the substrate for an OED may be formed in a structure in which the carrier substrate, the first polymer base layer, the optical functional layer, and the high refractive layer are sequentially stacked.

In one embodiment, the carrier substrate may be, for example, a glass substrate or a rigid substrate. As the glass substrate, without particular limitation, a suitable material may be used, and for example, a base layer including soda lime glass, barium/strontium-containing glass, lead glass, alumino silicate glass, borosilicate glass, barium borosilicate glass, or quartz may be used, but the present invention is not limited thereto. In one embodiment, as described in the following method of manufacturing a substrate for an OED, the carrier substrate may be formed to be detachable from the first polymer base layer.

Another aspect of the present application provides an organic electronic system including the above-described substrate for an OED. In one embodiment, the exemplary organic electronic system may include the substrate for an OED described above, an electrode layer formed on a high refractive layer of the substrate, a functional organic layer formed on the first electrode layer, and an electrode layer formed on the functional organic layer. Hereinafter, for distinguishment, the electrode layer formed on the substrate for an OED may be referred to as a first electrode layer, and the electrode layer formed on the functional organic layer may be referred to as a second electrode layer.

The organic layer may include at least an emitting layer. For example, when a transparent electrode layer is used as the first electrode layer and a reflective electrode layer is used as the second electrode layer, a bottom emitting device radiating light generated from an emitting layer of the organic layer to the base layer through the optical functional layer may be implemented.

In one embodiment, the OED may be an OLED. When the OED is an OLED, for example, the OED may have a structure in which the organic layer including at least an emitting layer is interposed between a hole injection electrode layer and an electron injection electrode layer. For example, when the electrode layer included in the substrate is a hole injection electrode layer, the second electrode layer is an electron injection electrode layer, and contrarily, when the electrode layer included in the substrate is an electron injection electrode layer, the second electrode layer may be a hole injection electrode layer.

The organic layer present between the electron and hole injection electrode layers may include at least one emitting layer. The organic layer may include a plurality of, for example, at least two, emitting layers. When the at least two emitting layers are included, the emitting layers may be divided by an inter-electrode layer having a charge emitting characteristic or a charge generating layer (CGL).

The emitting layer may be formed of, for example, various fluorescent or phosphorescent organic materials known in the art. An example of the material for the emitting layer may be, but is not limited to, a fluorescent material such as an Alq-based material such as tris(4-methyl-8-quinolinolate)aluminum(III) (Alg3), 4-MAlq3, or Gaq3; a cyclopentadiene derivative such as C-545T ($C_{26}H_{26}N_2O_2S$), DSA-amine, TBSA, BTP, PAP-NPA, spiro-FPA, $Ph_3Si$ (PhTDAOXD), 1,2,3,4,5-pentaphenyl-1,3-cyclopentadiene (PPCP); 4,4'-bis(2,2'-diphenylvinyl)-1,1'-biphenyl (DPVBi), distyryl benzene, or a derivative thereof; or 4-(dicyanomethylene)-2-tert-butyl-6-(1,1,7,7,-tetramethyl-julolidyl-9-enyl)-4H-pyran (DCJTB), DDP, AARP, or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, fac-tris[2-(4,5'-difluorophenyl)pyridine-C'2,N]iridium(III) (FIrppy), or bis(2-(2'-benzo[4,5-a]thienyl)pyridinato-N,C3')iridium(acetylactonate) ($Btp_2Ir(acac)$). The emitting layer may include the material as a host, and a host-dopant system including perylene, distyrylbiphenyl, DPT, quinacridone, rubrene, BTX, ABTX, or DCJTB as a dopant.

The emitting layer may also be formed by employing one suitable type selected from electron accepting organic compounds and electron donating organic compounds exhibiting an emitting characteristic to be described later.

The organic layer may be formed in various structures further including various functional layers known in the art as long as the emitting layer is included. The layer capable of being included in the organic layer may be an electron injection layer, a hole blocking layer, an electron transport layer, a hole transport layer or a hole injection layer.

The electron injection layer or the electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene, or phenanthrene or a derivative thereof; or a heterocyclic compound such as phenanthroline, bathophenanthroline, phenanthridine, acridine, quinoline, quinoxaline, or phenazine or a derivative thereof may be used. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene, or a derivative thereof; a metal chelate complex compound disclosed in a patent publication such as Japanese Laid-Open Patent Application No. 1988-295695, Japanese Laid-Open Patent Application No. 1996-22557, Japanese Laid-Open Patent Application No. 1996-81472, Japanese Laid-Open Patent Application No. 1993-009470, or Japanese Laid-Open Patent Application No. 1993-017764, for example, a metal complex having at least one of metal chelated oxinoid compounds such as 8-quinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in a patent publication such as Japanese Laid-Open Patent Application No. 1993-202011, Japanese Laid-Open Patent Application No. 1995-179394, Japanese Laid-Open Patent Application No. 1995-278124, or Japanese Laid-Open Patent Application No. 1995-228579; a triazine compound disclosed in a patent publication such as Japanese Laid-Open Patent Application No. 1995-157473; a stilbene derivative disclosed in a patent publication such as Japanese Laid-Open Patent Application No. 1994-203963; a distyrylarylene derivative; a styryl derivative disclosed in a patent publication such as Japanese Laid-Open Patent Application No. 1994-132080 or Japanese Laid-Open Patent Application No. 1994-88072; a diolefin derivative disclosed in a patent publication such as Japanese Laid-Open Patent Application No. 1994-100857 or Japanese Laid-Open Patent Application No. 1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl) benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine; a dimethylidene compound such as 1,4-phenylenedimethylidene, 4,4'-phenylenedimethylidene, 2,5-xylene dimethylidene, 2,6-naphthylenedimethylidene, 1,4-biphenylenedimethylidene, 1,4-para-terephenylene dimethylidene, 9,10-anthracenediyldimethylidine, or 4,4'-(2,2-di-tibutylphenylvinyl)biphenyl, 4,4'-(2,2-diphenylvinyl) biphenyl, or a derivative thereof; a silanamine derivative disclosed in a patent publication such as Japanese Laid-Open Patent Application No. 1994-49079 or Japanese Laid-Open Patent Application No. 1994-293778; a multifunctional styryl compound disclosed in a patent publication such as Japanese Laid-Open Patent Application No. 1994-279322 or Japanese Laid-Open Patent Application No. 1994-279323; an oxadiazole derivative disclosed in a patent publication such as Japanese Laid-Open Patent Application No. 1994-107648 or Japanese Laid-Open Patent Application No. 1994-092947; an anthracene compound disclosed in a patent publication such as Japanese Laid-Open Patent Application No. 1994-206865; an oxinate derivative disclosed in a patent publication such as Japanese Laid-Open Patent Application No. 1994-145146; a tetraphenyl butadiene compound disclosed in a patent publication such as Japanese Laid-Open Patent Application No. 1992-96990; an organic trifunctional compound disclosed in a patent publication such as Japanese Laid-Open Patent Application No. 1991-296595; a coumarin derivative disclosed in a patent publication such as Japanese Laid-Open Patent Application No. 1990-191694; a perylene derivative disclosed in a patent publication such as Japanese Laid-Open Patent Application No. 1990-196885; a naphthalene derivative disclosed in a patent publication such as Japanese Laid-Open Patent Application No. 1990-255789; a phthaloperynone derivative disclosed in a patent publication such as Japanese Laid-Open Patent Application No. 1990-289676 or Japanese Laid-Open Patent Application No. 1990-88689; or a styryl amine derivative disclosed in a patent publication such as Japanese Laid-Open Patent Application No. 1990-250292 may be used as an electron accepting organic compound included in a low refractive layer. In addition, here, the electron injection layer may be formed using, for example, a material such as LiF or CsF.

The hole blocking layer may be a layer capable of enhancing a life span and efficiency of the device by preventing approach of injected holes to an electron injection electrode layer through the emitting layer, and may be formed in a suitable part between the emitting layer and the electron injection electrode layer using a known material when needed.

The hole injection layer or hole transport layer may include, for example, an electron donating organic compound. As the electron donating organic compound, N,N', N'-tetraphenyl-4,4'-diaminophenyl, N,N'-diphenyl-N,N'-di (3-methylphenyl)-4,4'-diaminobiphenyl, 2,2-bis(4-di-p-tollylaminophenyl)propane, N,N,N',N'-tetra-p-tollyl-4,4'-diaminobiphenyl, bis(4-di-p-tollylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tollyl)amine, 4-(di-p-tollylamino)-4'-[4-(di-p-tollylamino)styryl]stilbene, N,N,N',N'-tetraphenyl-4, 4'-diaminobiphenyl N-phenylcarbazole, 4,4'-bis[N-(1-naphthyl)-N-phenyl-amino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4''-bis[N-(1-anthryl)-N-phenylamino]-p-terphenyl, 4,4'-bis[N-(2-phenanthryl)-N-phenylamino]biphenyl, 4,4'-bis [N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tollylamino)naphthalene, 2,6-bis[di-(1-naphthyl)amino] naphthalene, 2,6-bis[N-(1-naphthyl)-N-(2-naphthyl)amino] naphthalene, 4,4'-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyl)amino]fluorine, or 4,4''-bis(N,N-di-p-tollylamino)terphenyl, or an aryl amine compound such as bis(N-1-naphthyl)(N-2-naphthyl)amine may be used, but the present invention is not limited thereto.

The hole injection layer or hole transport layer may be formed by dispersing the organic compound in a polymer or using a polymer derived from the organic compound. In addition, a π-conjugated polymer such as polyparaphenylenevinylene and a derivative thereof, a hole transport non-conjugated polymer such as poly(N-vinylcarbazole), or a σ-conjugated polymer of a polysilane may also be used.

The hole injection layer may be formed using an electrically conductive polymer such as a metal phthalocyanine such as copper phthalocyanine, a non-metal phthalocyanine, a carbon layer, or a polyaniline, or by reaction with a Lewis acid using the aryl amine compound as an oxidizing agent.

For example, the OLED may be formed in a type of (1) a hole injection electrode layer/an organic emitting layer/an electron injection electrode layer; (2) a hole injection electrode layer/a hole injection layer/an organic emitting layer/ an electron injection electrode layer; (3) a hole injection electrode layer/an organic emitting layer/an electron injection layer/an electron injection electrode layer; (4) a hole injection electrode layer/a hole injection layer/an organic emitting layer/an electron injection layer/an electron injection electrode layer; (5) a hole injection electrode layer/an organic semiconductor layer/an organic emitting layer/an electron injection electrode layer; (6) a hole injection electrode layer/an organic semiconductor layer/an electron barrier layer/an organic emitting layer/an electron injection electrode layer; (7) a hole injection electrode layer/an organic semiconductor layer/an organic emitting layer/an adhesion-improving layer/an electron injection electrode layer; (8) a hole injection electrode layer/a hole injection layer/a hole transport layer/an organic emitting layer/an electron injection layer/an electron injection electrode layer; (9) a hole injection electrode layer/an insulating layer/an organic emitting layer/an insulating layer/an electron injection electrode layer; (10) a hole injection electrode layer/an inorganic semiconductor layer/an insulating layer/an organic emitting layer/an insulating layer/an electron injection electrode layer; (11) a hole injection electrode layer/an organic semiconductor layer/an insulating layer/an organic emitting layer/an insulating layer/an electron injection electrode layer; (12) a hole injection electrode layer/an insulating layer/a hole injection layer/a hole transport layer/an organic emitting layer/an insulating layer/an electron injection electrode layer or (13) a hole injection electrode layer/an insulating layer/a hole injection layer/a hole transport layer/an organic emitting layer/an electron injection layer/an electron injection electrode layer, which are sequentially formed, and in some cases, the OLED may have an organic layer having a structure in which at least two emitting layers are divided by an inter-electrode layer having a charge generating characteristic or CGL between a hole injection electrode layer and an electron injection electrode layer, but the present invention is not limited thereto.

Various materials for forming a hole or electron injection electrode layer and an organic layer, for example, an emitting layer, an electron injection or transport layer, or a hole injection or transport layer and methods of forming the same are known in the art, and all of the above-described methods may be applied to manufacture the organic electronic system.

The organic electronic system may further include an encapsulating structure. The encapsulating structure may be a protective structure for preventing inflow of an external material such as moisture or oxygen to the organic layer of the organic electronic system. The encapsulating structure may be, for example, a can such as a glass can or metal can, or a film covering an entire surface of the organic layer.

FIG. 4 shows that a first electrode layer 401, an organic layer 402 and a second electrode layer 403 formed on a substrate including a first polymer base layer 101, an optical functional layer 102, and a high refractive layer 103, which are sequentially formed, are protected by an encapsulating structure 404 having a can structure, such as a glass can or a metal can. As shown in FIG. 4, the encapsulating structure 404 may be attached to the substrate by, for example, an adhesive. For example, the encapsulating structure may be adhered to the high refractive layer below which the first electrode layer is not present in the substrate. For example, the encapsulating structure 404 as shown in FIG. 4 may be attached to an end of the substrate by the adhesive 405. In such a method, a protecting effect through the encapsulating structure may be maximized.

The encapsulating structure may be, for example, a film coating entire surfaces of the first electrode layer, the organic layer and the second electrode layer. FIG. 5 shows an encapsulating structure 501 formed in a film type covering entire surfaces of the first electrode layer 401, the organic layer 402 and the second electrode layer 403. For example, as shown in FIG. 5, the film-type encapsulating structure 501 may have a structure which coats entire surfaces of the first electrode layer 401, the organic layer 402 and the second electrode layer 403, and in which a substrate including the first polymer base layer 101, the optical functional layer 102, and the high refractive layer 103 is adhered to a second substrate 502 disposed thereon. Here, the second substrate may be, for example, a glass substrate, a metal substrate, a polymer film, or a barrier layer. The film-type encapsulating structure may be formed by, for example, coating a liquid material cured by heat or UV irradiation such as an epoxy resin, and curing the coated material, or laminating the substrate and the upper substrate using an adhesive sheet previously manufactured in a film type using the epoxy resin.

The encapsulating structure may include a water adsorbent or a getter such as a metal oxide such as calcium oxide or beryllium oxide, a metal halide such as calcium chloride, or phosphorus pentoxide as needed. For example, the water adsorbent or getter may be included in a film-type encapsulating structure, or located at a predetermined position of a can-type encapsulating structure. The encapsulating structure may further include a barrier film or conductive film.

Still another as aspect of the present application provides a method of manufacturing a substrate for an OED or an organic electronic system. In one embodiment, the substrate for an OED may be manufactured by forming a first polymer base layer on a carrier substrate, forming an optical functional layer on the first polymer base layer, and forming a high refractive layer on the optical functional layer.

The exemplary method of manufacturing a substrate for an OED includes forming a first polymer base layer on a carrier layer. Here, as the carrier substrate, for example, a rigid substrate such as glass may be used, but the present invention is not limited thereto. The same contents described in the category of, for example, the carrier substrate of the above-described substrate for an OED may apply to the carrier substrate.

The first polymer base layer may be formed by, for example, laminating a polymer film, or coating a coating solution including a polymer on the carrier substrate. In this case, the carrier substrate may be formed such that a film or coating layer to be formed thereon is detachable. The first polymer base layer may be formed through, for example, the above-described coating method such as wet coating, or a deposition method such as CVD or PVD.

In one embodiment, when the first polymer base layer includes a polyimide, the polyimide base layer may be formed by laminating a polyimide film on the carrier substrate, or coating a coating solution prepared by diluting a poly(amic acid) as a precursor in a suitable solvent on the carrier substrate and performing imidization. In another embodiment, the polyimide base layer may be formed by laminating a polyimide film on the carrier substrate, coating a coating solution including a poly(amic acid) thereon, and performing imidization.

The manufacturing method further includes forming an optical functional layer on the first polymer base layer after the first polymer base layer is formed. In one embodiment, the optical functional layer may be formed in an amount of 10% to 50%, 20% to 40%, or 25% to 35%. For example, the optical functional layer may be formed by the above-described coating method, a deposition method such as CVD or PVD, nanoimprinting, or microembossing.

The manufacturing method further includes forming a high refractive layer on the optical functional layer after the optical functional layer is formed. In one embodiment, the high refractive layer may be formed to have a refractive index with respect to light with a wavelength of 633 nm of 1.6 to 2.0, 1.8 to 1.95, or 1.85 to 1.90. The high refractive layer may be formed through, for example, the above-described coating method, a deposition method such as CVD or PVD, nanoimprinting, or microembossing.

The method of manufacturing an OED may further include sequentially forming a first electrode layer, a functional organic layer including an emitting layer, and a second electrode layer on the substrate for an OED manufactured by the above-described method, and forming an encapsulating structure when needed. In addition, the carrier substrate used in the manufacture of the OED may be removed when needed after the process is completed. Methods of forming the first and second electrode layers are not particularly limited, and may include a known optional method such as deposition, sputtering, chemical deposition or an electrochemical method. In addition, the organic layer and the encapsulating structure may be formed by a known method.

Yet another as aspect of the present application provides a use of the organic electronic system, for example, the organic light emitting system. The organic light emitting system may be effectively applied to a backlight of a liquid crystal display (LCD), lightings, sensors, printers, a light source of a copy machine, a light source for an automobile gauge, a signal light, a pilot lamp, a display device, a light source for a planar emitting device, a display, decorations or other kinds of lights. In one embodiment, the present invention relates to a lighting device including the OLED. When the OLED is applied to the lighting device or for different uses, other components constituting the device and a method of constituting the device are not particularly limited, but all of optional materials or methods known in the related art may be implemented as long as these are used in the OLED.

Advantageous Effects

A substrate for an OED according to the present application may form an organic electrode system having excellent performances including light extraction efficiency.

MODE FOR INVENTION

Figure 1:
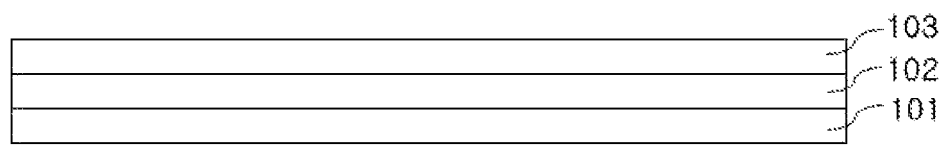
FIG. 1 shows a schematic diagram of an exemplary substrate for an OED.
Figure 2:
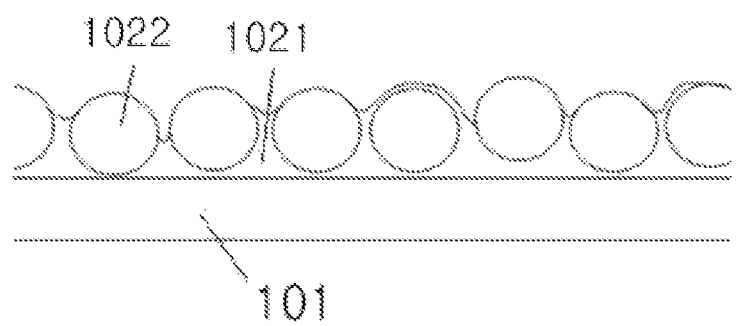
FIGS. 2 and 3 show schematic diagrams of exemplary optical functional layers.
Figure 3:
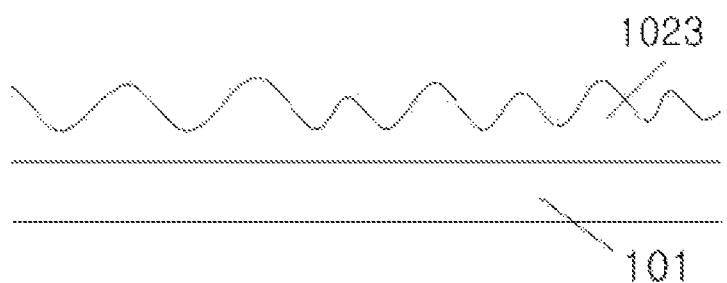
Figure 4:
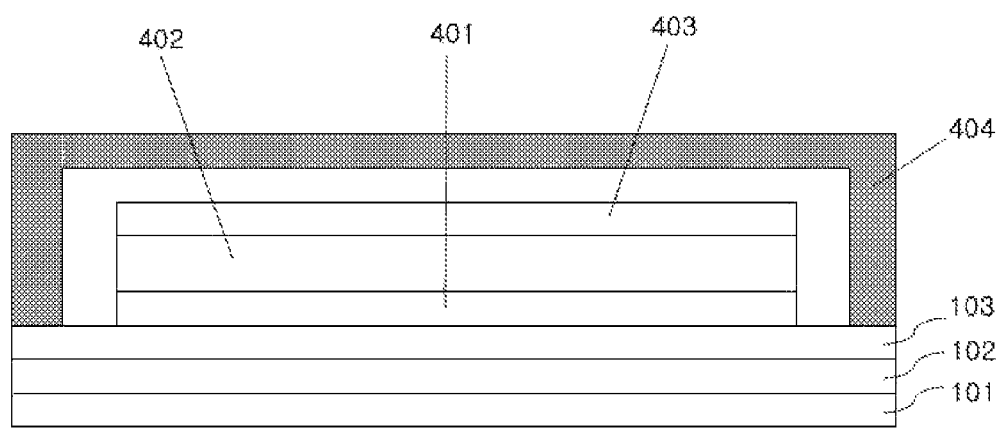
FIGS. 4 and 5 show schematic diagrams of exemplary organic electronic system.
Figure 5:
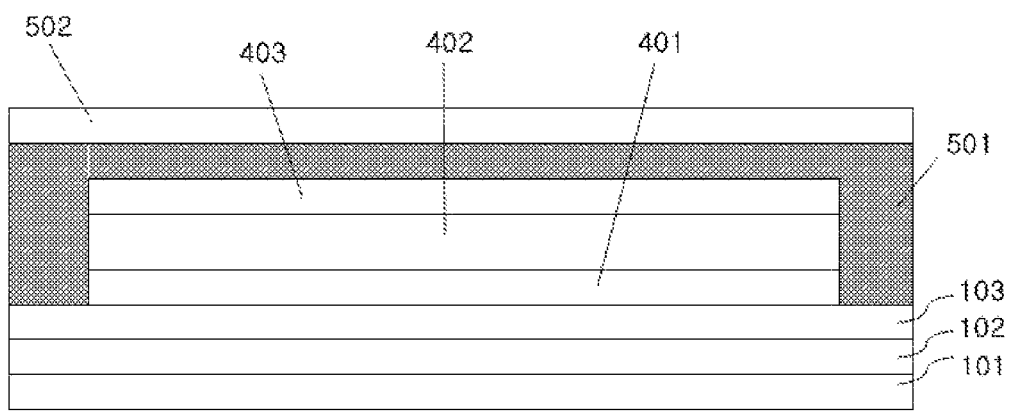

Hereinafter, the above-described substrate will be explained in more detail with reference to Examples and Comparative Example, but the scope of the liquid crystal alignment film is not limited to the following Examples.

EXAMPLE 1

Manufacture of Substrate for OED

A substrate for an OED and an OED were manufactured using glass as a carrier substrate. First, a coating solution having a molecular weight (Mw) of approximately 50,000 as a coating solution including a poly(amic acid) synthesized by a known method of synthesizing a poly(amic acid) using a compound of Formula A (3,3'-sulfonyldianiline) and a compound of Formula B (3,3',4,4'-biphenyltetracarboxylic dianhydride) was coated on the carrier substrate to have a thickness of approximately 30 µm and imidized, thereby forming a first polymer base layer having a refractive index with respect to light with a wavelength of 633 nm of approximately 1.7 to 1.8.

Subsequently, a coating solution for a light scattering layer was manufactured by blending scattering particles (titanium oxide particles) having an average particle size of approximately 200 nm in a sol-gel coating solution including tetramethoxy silane as a condensable silane and sufficiently dispersing the blend. A light scattering layer was formed to have a thickness of approximately 300 nm by coating the coating solution on the first polymer base layer, and performing a sol-gel reaction at 200° C. for approximately 30 minutes. A haze of the light scattering layer was evaluated to be approximately 30% using HM-150 according to JIS K 7105. Afterward, a high refractive coating solution prepared by blending high refractive titanium oxide particles having an average particle size of approximately 10 nm and a refractive index of approximately 2.5 with a sol-gel coating solution including tetramethoxy silane was coated on the light scattering layer as described above, and a planarization layer having a refractive index with respect to light with a wavelength of 633 nm of approximately 1.8, and a thickness of approximately 300 nm was formed by performing a sol-gel reaction as described above.

Afterward, a substrate for an OED was manufactured by forming a second polymer base layer using a polyimide on the planarization layer as described above in the formation of the first polymer base layer to have a thickness of approximately 1 µm.

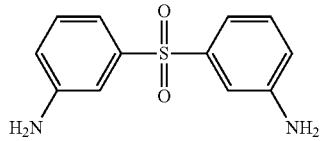

[Formula A]

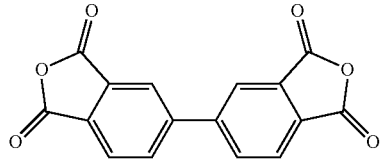

[Formula B]

Manufacture of OED

A hole injection electrode layer including indium tin oxide was formed on a second polymer base layer by a known sputtering method. Subsequently, a hole injection layer, a hole transport layer, an emitting layer, an electron transport layer, an electron injection layer, and an electron injection electrode layer were formed using known materials and methods. Afterward, the structure was encapsulated with a glass can, thereby manufacturing an organic light emitting system.

COMPARATIVE EXAMPLE 1

A substrate for an OED and an organic light emitting system were manufactured by the same method as described in Example 1, except that a layer having a haze measured using HM-150 according to JIS K 7105 of less than 1% was used without using scattering particles in measurement of a coating solution for a light scattering layer.

Absolute quantum efficiencies and driving voltages of Example 1 and Comparative Example 1 are shown in Table 1. The evaluation of the absolute quantum efficiency in Table 1 was performed by a known method.

TABLE 1

|   | Driving voltage (V) | Absolute quantum efficiency (%) |
| --- | --- | --- |
| Example 1 | 6.2 | 48.1 |
| Comparative Example 1 | 6.3 | 29 |

REFERENCE NUMERALS OF DRAWINGS

1: substrate for OED
101: first polymer base layer
102: optical functional layer 103: high refractive layer
1021: matrix material
1022: scattering region
1023: light scattering layer having an uneven structure
401: first electrode layer
402: organic layer
403: second electrode layer
404: encapsulating structure having a can structure
501: encapsulating structure formed in a film type
502: second substrate

What is claimed is:

1. A substrate for an organic electronic device (OED), comprising:
   a first polymer base layer having a refractive index with respect to light with a wavelength of 633 nm of 1.6 or more;
   an optical functional layer formed on the first polymer base layer; and
   a high refractive layer including a planarization layer formed on the optical functional layer and having a refractive index with respect to light of a wavelength of 633 nm of 1.7 or more and a second polymer base layer formed on the planarization layer and having a refractive index with respect to light with a wavelength of 633 nm of 1.6 or more,
   wherein the optical functional layer is a light scattering layer including a matrix material and scattering particles having a different refractive index of more than 0.3 from the matrix material.

2. The substrate according to claim 1, wherein the first polymer base layer includes a poly(amic acid), polyimide, polyethylene naphthalate, polyether ether ketone, polycarbonate, polyethylene terephthalate, polyether sulfide, polysulfone acryl resin, polystyrene, or epoxy resin.

3. The substrate according to claim 1, wherein the light scattering layer is a layer having an uneven structure.

4. The substrate according to claim 1, wherein the planarization layer includes a poly(amic acid), polyimide, polysiloxane, or epoxy resin.

5. The substrate according to claim 4, wherein the planarization layer further includes particles having a refractive index with respect to light with a wavelength of 633 nm of 1.8 or more and an average particle size of 50 nm or less.

6. The substrate according to claim 1, further comprising:
   a carrier substrate,
   wherein a side of the first polymer base layer opposite to the optical functional layer is in contact with the carrier substrate.

7. An organic electronic system, comprising:
   a substrate for an organic electronic device (OED), comprising:
      a first polymer base layer having a refractive index with respect to light with a wavelength of 633 nm of 1.6 or more;
      an optical functional layer formed on the first polymer base layer; and
      a high refractive layer including a planarization layer formed on the optical functional layer and having a refractive index with respect to light of a wavelength of 633 nm of 1.7 or more and a second polymer base layer formed on the planarization layer and having a refractive index with respect to light with a wavelength of 633 nm of 1.6 or more,
      wherein the optical functional layer is a light scattering layer including a matrix material and scattering particles having a different refractive index of more than 0.3 from the matrix material;
   a first electrode formed on a high refractive layer of the substrate;
   a functional organic layer formed on the first electrode; and
   a second electrode formed on the functional organic layer.

8. A light source for a display, comprising:
   an organic electronic system, comprising:
      a substrate for an organic electronic device (OED), comprising:
         a first polymer base layer having a refractive index with respect to light with a wavelength of 633 nm of 1.6 or more;
         an optical functional layer formed on the first polymer base layer; and
         a high refractive layer including a planarization layer formed on the optical functional layer and having a refractive index with respect to light of a wavelength of 633 nm of 1.7 or more and a second polymer base layer formed on the planarization layer and having a refractive index with respect to light with a wavelength of 633 nm of 1.6 or more,
         wherein the optical functional layer is a light scattering layer including a matrix material and scattering particles having a different refractive index of more than 0.3 from the matrix material;
      a first electrode formed on a high refractive layer of the substrate;
      a functional organic layer formed on the first electrode; and
      a second electrode formed on the functional organic layer.

9. A lighting device, comprising:
   an organic electronic system, comprising:
      a substrate for an organic electronic device (OED), comprising:
         a first polymer base layer having a refractive index with respect to light with a wavelength of 633 nm of 1.6 or more;
         an optical functional layer formed on the first polymer base layer; and
         a high refractive layer including a planarization layer formed on the optical functional layer and having a refractive index with respect to light of a wavelength of 633 nm of 1.7 or more and a second polymer base layer formed on the planarization layer and having a refractive index with respect to light with a wavelength of 633 nm of 1.6 or more,
         wherein the optical functional layer is a light scattering layer including a matrix material and scattering particles having a different refractive index of more than 0.3 from the matrix material;
      a first electrode formed on a high refractive layer of the substrate;
      a functional organic layer formed on the first electrode; and
      a second electrode formed on the functional organic layer.

10. A method of manufacturing a substrate for an organic electronic device (OED), comprising:
    forming a first polymer base layer having a refractive index with respect to light with a wavelength of 633 nm of 1.6 or more on a carrier substrate;
    forming an optical functional layer on the first polymer base layer; and
    forming a high refractive layer including a planarization layer formed on the optical functional layer and having a refractive index with respect to light of a wavelength of 633 nm of 1.7 or more and a second polymer base layer formed on the planarization layer and having a refractive index with respect to light with a wavelength of 633 nm of 1.6 or more,
wherein the optical functional layer is a light scattering layer including a matrix material and scattering particles having a different refractive index of more than 0.3 from the matrix material.

11. The method according to claim 10, wherein the first polymer base layer is formed by laminating a polymer film or coating a coating solution including a polymer, on the carrier substrate.

12. A method of manufacturing an organic electronic system, comprising:
sequentially forming a first electrode, a functional organic layer, and a second electrode on a substrate for the organic electronic device,
wherein the substrate is manufactured by:
forming a first polymer base layer having a refractive index with respect to light with a wavelength of 633 nm of 1.6 or more on a carrier substrate;
forming an optical functional layer on the first polymer base layer; and
forming a high refractive layer including a planarization layer formed on the optical functional layer and having a refractive index with respect to light of a wavelength of 633 nm of 1.7 or more and a second polymer base layer formed on the planarization layer and having a refractive index with respect to light with a wavelength of 633 nm of 1.6 or more,
wherein the optical functional layer is a light scattering layer including a matrix material and scattering particles having a different refractive index of more than 0.3 from the matrix material.

* * * * *